US008680940B2

(12) United States Patent
Morris, III

(10) Patent No.: US 8,680,940 B2
(45) Date of Patent: Mar. 25, 2014

(54) TUNABLE MATCHING NETWORK CIRCUIT TOPOLOGY DEVICES AND METHODS

(75) Inventor: Arthur S. Morris, III, Raleigh, NC (US)

(73) Assignee: Wispry, Inc., Irvine, CA (US)

(*) Notice: Subject to any disclaimer, the term of this patent is extended or adjusted under 35 U.S.C. 154(b) by 541 days.

(21) Appl. No.: 13/007,241

(22) Filed: Jan. 14, 2011

(65) Prior Publication Data

US 2011/0175687 A1 Jul. 21, 2011

Related U.S. Application Data

(60) Provisional application No. 61/336,072, filed on Jan. 15, 2010.

(51) Int. Cl.
*H03H 7/38* (2006.01)

(52) U.S. Cl.
USPC .......................................................... 333/32

(58) Field of Classification Search
USPC .......................................................... 333/32
See application file for complete search history.

(56) References Cited

U.S. PATENT DOCUMENTS

| 4,015,223 | A | 3/1977 | Cheze |
| 2004/0263411 | A1 | 12/2004 | Jorge et al. |
| 2005/0095998 | A1 | 5/2005 | Toncich |
| 2006/0141978 | A1 | 6/2006 | Liu |
| 2008/0055016 | A1* | 3/2008 | Morris et al. ................. 333/129 |
| 2009/0267705 | A1 | 10/2009 | Morris |
| 2011/0175687 | A1 | 7/2011 | Morris, III |

FOREIGN PATENT DOCUMENTS

| EP | 1 100 193 | 5/2001 |
| EP | 2524428 | 11/2012 |
| WO | WO 2005/084090 | 9/2005 |

OTHER PUBLICATIONS

International Search Report and Written Opinion for PCT Application No. PCT/US2011/021357 dated Sep. 15, 2011.
Jia-Shiang Fu et al., "A ferroelectric-based impedance tuner for adaptive matching applications," Microwave Symposium Digest, 2008 IEEE MTT-S International, IEEE, Piscataway, NJ, USA, Jun. 15, 2008, pp. 955-958.
Extended European Search Report for Application No. EP 11 73 3465 dated Jul. 11, 2013.

* cited by examiner

*Primary Examiner* — Stephen Jones
(74) *Attorney, Agent, or Firm* — Jenkins, Wilson, Taylor & Hunt, P.A.

(57) ABSTRACT

Methods and devices for modifying a tunable matching network are disclosed. In one aspect, a method of modifying a tunable matching network can include connecting one or more shunt inductors to a tunable matching network exhibiting parasitic capacitance to ground, whereby high-frequency performance of the tunable matching network is improved.

17 Claims, 5 Drawing Sheets

TUNABLE MATCHING NETWORK CIRCUIT TOPOLOGY DEVICES AND METHODS

RELATED APPLICATIONS

The presently disclosed subject matter claims priority to U.S. Patent Application Ser. No. 61/336,072, filed Jan. 15, 2010, the disclosure of which is incorporated herein by reference in its entirety.

TECHNICAL FIELD

The subject matter disclosed herein relates generally to impedance matching used in electronic devices. More particularly, the subject matter disclosed herein relates to tunable matching networks and circuit topologies for such networks.

BACKGROUND

Each non-grounded capacitor pin in a matching network has a parasitic capacitance to ground. This parasitic capacitance is usually proportional to size of the tunable capacitance, with the parasitic being smaller in higher performance technologies. In the PI, double-PI, bypassed PI, bypassed double PI and distributed lumped inductor single PI topologies, the various parasitics from all capacitors can contribute to a large total parasitic, which can lead to impaired high frequency performance in widely tunable networks. As a result, parasitic capacitance to ground is one of the key barriers to achieving the full capabilities of the network. Much effort has been expended to lower the parasitic capacitances of each of the components in a network, but for some applications, the parasitics may still limit the applicability of the network. Additionally, it is widely understood in this field that RF elements near the antenna require robust protection against electro-static discharge (ESD) events, and matching networks are no exception. For instance, circuit configurations that do not have any low-frequency path to ground enable the full ESD voltage to be developed across the component, possibly leading to damage.

Accordingly, tunable matching networks that can lower the effective parasitic capacitance while still providing protection against ESD voltage would be desirable.

SUMMARY

In accordance with this disclosure, methods and devices for modifying a tunable matching network are provided. In one aspect, a method of modifying a tunable matching network is provided. The method can comprise connecting one or more shunt inductors to a tunable matching network exhibiting parasitic capacitance to ground, whereby high-frequency performance of the tunable matching network is improved.

In another aspect, a modified tunable matching network comprises a tunable matching network exhibiting parasitic capacitance to ground and one or more shunt inductors connected to the tunable matching network for improving the high-frequency performance of the tunable matching network.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

As discussed above, parasitic capacitance to ground can lead to impaired high frequency performance in widely tunable networks. For example, in a conventional distributed lumped inductor single PI network having four tunable capacitors, it can be assumed that each terminal of each capacitor has a parasitic to ground of 10% of the maximum value of the capacitor. In this case, a network with 4 pF for each of the three shunt tunable capacitors and 4 pF of tunable capacitance for the series capacitor has a total parasitic to ground of 2.0 pF (3×0.4 pF+2×0.4 pF). The inductors will typically also exhibit some parasitic capacitance to ground. If it is further assumed that this additional parasitic capacitance adds about 1 pF, a total of 3 pF is present in the system. If this network is to be used in a multi-band cellular application, it is generally desirable that high performance be maintained down to at least 800 MHz and in some cases below 700 MHz. For this requirement, the added shunt inductance can be greater than 13 nH (and likely about 20 nH) to keep the LC resonance below this frequency. If more parasitic capacitance is present, smaller inductor values could be used and vice versa.

For each network, it is relevant to note the performance for the highest frequency loss for the well-matched case and the reflection performance for the poor voltage standing wave ratio (VSWR) case at the lowest frequency. FIGS. 2, 4, 6, and 8 illustrate the behavior of each network topology for typical element values and capacitor parasitics. For the purposes of these graphs, the baseline matching topologies above are all low-pass circuits with pass bands extending to DC. In addition, for these graphs, it is assumed that the available tunable capacitance is about 20 pF, capacitive parasitics to ground per capacitor pin are about 0.16 pF, intrinsic capacitor ratios are about 20:1, and feed inductance at input and output is about 1 nH.

Figure 1:
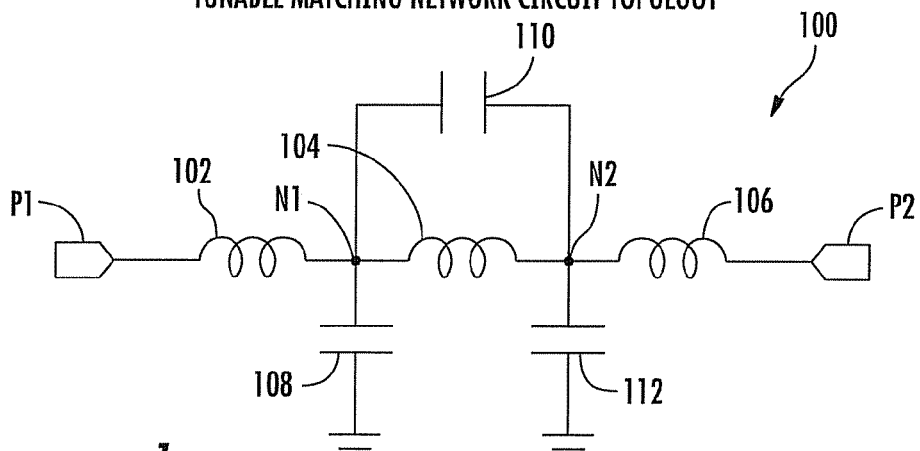
FIG. 1 is a circuit arrangement for a baseline single section PI tunable matching network.
Figure 2:
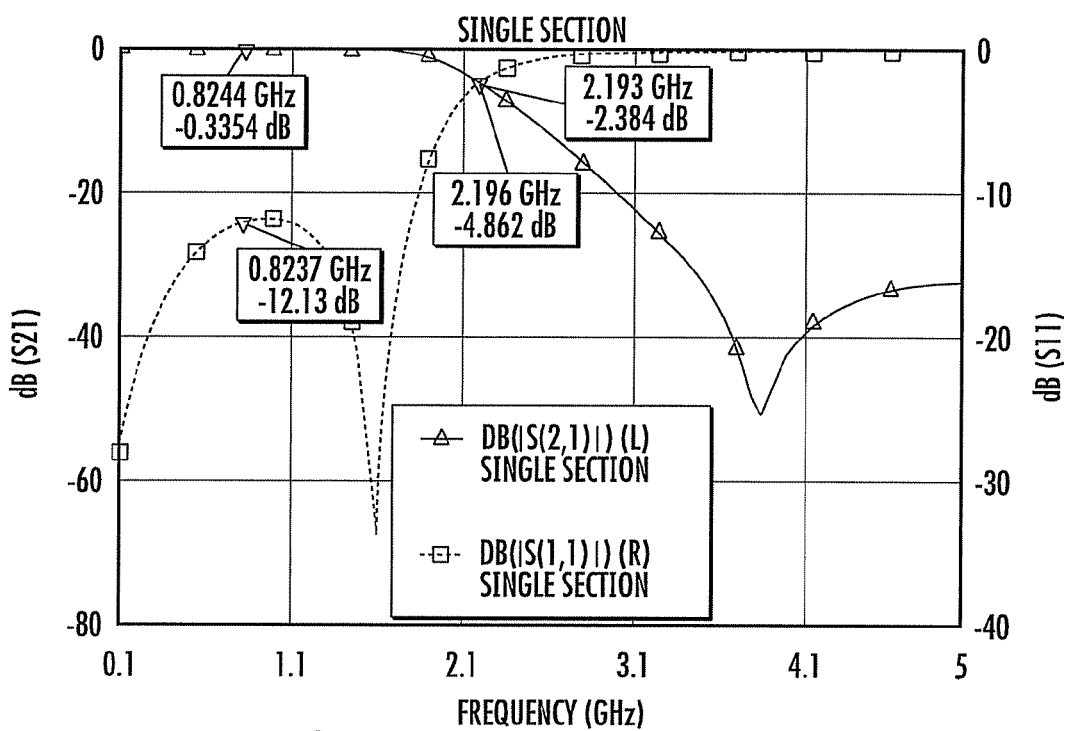
FIG. 2 is a graph of the frequency response of the circuit arrangement shown in FIG. 1.

For example, a single section PI network, generally designated 100, is shown in FIG. 1 as comprising a first inductor 102, a second inductor 104, and a third inductor 106 connected in series between a first port P1 and a second port P2. In one example, first and second ports P1 and P2 can be connected to a source and a load, respectively. Network 100 can also comprise first, second, and third capacitors 108, 110, and 112. One terminal of first capacitor 108 can be connected to a first node N1 between first inductor 102 and second inductor 104, with the other terminal of first capacitor 108 being connected to a local voltage reference (i.e., a ground). Similarly, one terminal of third capacitor 112 can be connected to a second node N2 between second inductor 104 and third inductor 106, with the other terminal of third capacitor 112 being connected to a local voltage reference. Second capacitor 110 can be connected in parallel with second inductor 104. In particular, second capacitor 110 can be a variable capacitor configured to tune a self-resonant frequency and a reactive impedance of second inductor 102.

For this circuit arrangement, it can be assumed that an inductance value is about 4.3 nH and a tunable capacitor configuration comprises the three capacitors having values of 6, 8, and 6 pF, respectively. For this network, it can be seen in the graph shown in FIG. 2 that setting the capacitor values to minimum yields the high-frequency transparent setting. It is further noted that the high frequency transparent setting has rolled off significantly at 2.2 GHz due to parasitics. Despite being aware of this issue, however, the values of the elements cannot be reduced to reduce the associated parasitics because a network having this configuration is already "near the cliff" for low-frequency tuning. Variations in the inductance value and tunable capacitance allocation may be used to improve either the low or high frequency responses but only to the detriment of the other.

Figure 3:
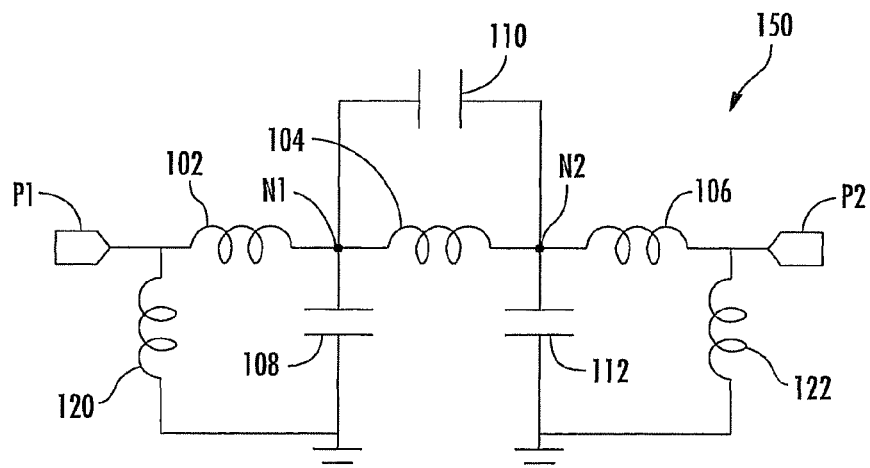
FIG. 3 is a circuit arrangement for a tunable matching network according to an embodiment of the presently disclosed subject matter.

To address this issue, FIG. 3 shows a modified single section PI network, generally designated 150, which further comprises a first shunt inductor 120 and a second shunt inductor 122 connected at one end to first port P1 and second port P2, respectively, and at the other end to a ground. First and second shunt inductors 120 and 122 can be connected in any of a variety of ways. Specifically, for example, connecting one or more shunt inductors can comprise connecting an external shunt inductor to the tunable matching network or integrating an internal shunt inductor case with the tunable matching network.

Figure 4:
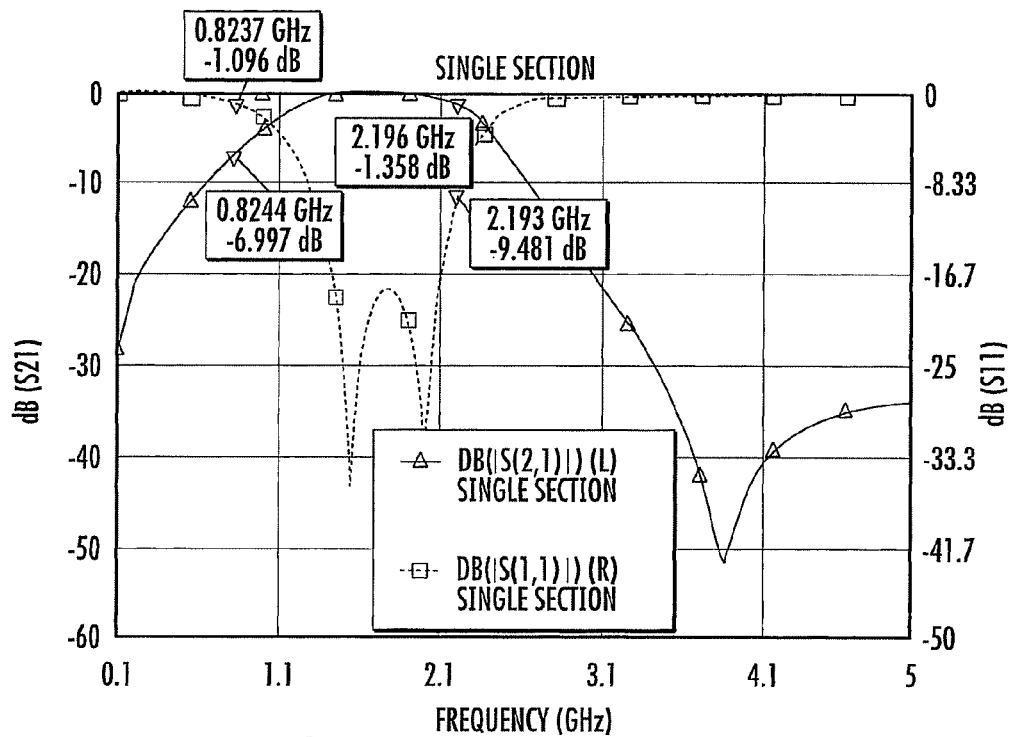
FIG. 4 is a graph of the frequency response of the tunable matching network shown in FIG. 3.

By adding such shunt inductors to the network, at least a portion of the capacitance to ground can be tuned out, which can in turn lead to much improved high frequency performance. However, adding one or more shunt inductors can cause the lowest frequencies to roll off. The proper choice of shunt inductor value for a given parasitic capacitance can be set by the desired low frequency limit of the matching network. For example, referring to the circuit configuration shown in FIG. 3, if shunt inductors of 5 nH are added to both input and output, the resulting system can exhibit improved transparency at 2.2 GHz even though the low frequency response has rolled off significantly as shown in FIG. 4. Thus, the specifications of first and second shunt inductors 120 and 122 can be selected to maintain acceptable tuning performance for both the desired low and high frequency limits of the matching network.

Figure 5:
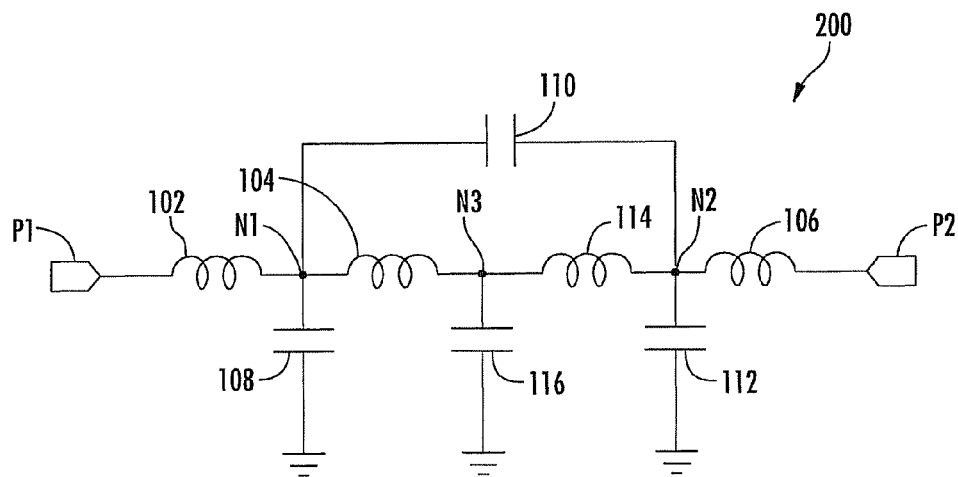
FIG. 5 is a circuit arrangement for a baseline transmission line bypass tunable matching network.

The advantageous effect of such shunt inductors can likewise be applied in a design that uses a distributed LC transmission line, and example of which is shown in FIG. 5. As compared to the single PI network arrangement discussed above, in this network, generally designated 200, a fourth inductor 114 can be connected in series between second inductor 104 and third inductor 106, with both second inductor 104 and fourth inductor 114 being connected in parallel with second capacitor 110. In this arrangement, second capacitor 110 can be a variable capacitor configured to tune a self-resonant frequency of the series combination of second inductor 104 and fourth inductor 114. In addition, a fourth capacitor 116 can be connected at one terminal to a third node N3 between second inductor 104 and fourth inductor 114, with the other terminal of fourth capacitor 116 being connected to a local voltage reference. A network having this configuration is discussed in U.S. patent application Ser. No. 12/429,868, filed Apr. 24, 2009, entitled "Tunable Matching Network Circuit Topology", the disclosure of which is incorporated herein by reference in its entirety.

Figure 6:
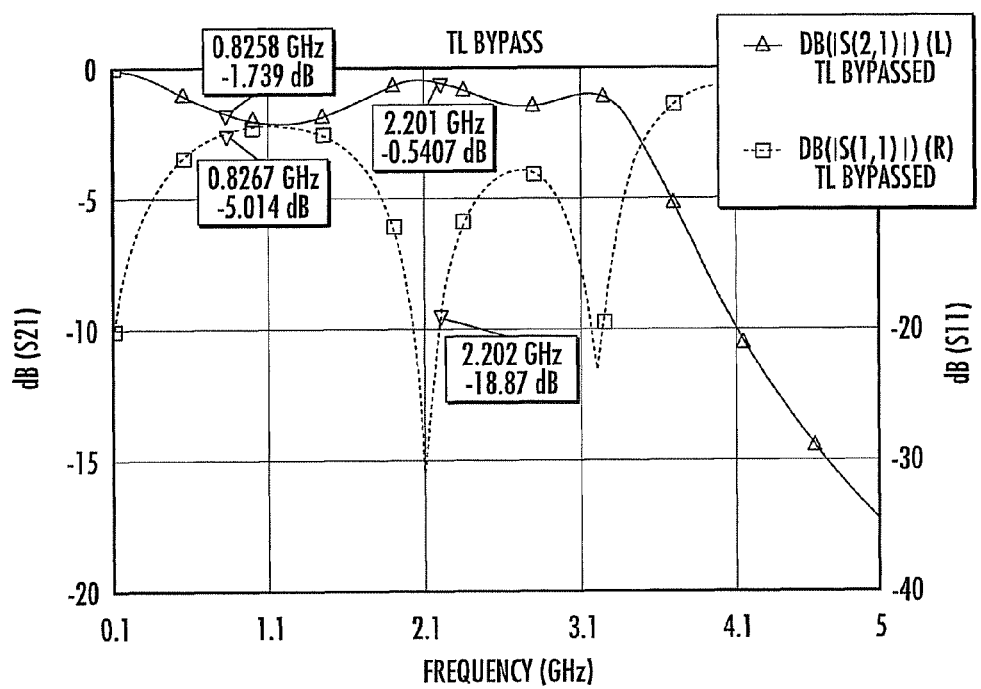
FIG. 6 is a graph of the frequency response of the circuit arrangement shown in FIG. 5.

In this configuration, network 200 comprises variable capacitive shunt loads and a bypass capacitor from input to output. For example, both of second inductor 104 and fourth inductor 114 can be 2.15 nH inductors, first and third inductors 102 and 106 can be as small as possible, and the capacitors can be distributed as 4-0-4-0-4-8 using a common coding scheme (i.e., second capacitor 110 is an 8 pF capacitor, and 108, 112, fourth and capacitor 116 are 4 pF capacitors). If network 200 having this configuration is set to the transparent case, the frequency response graph shown in FIG. 6 is obtained.

Figure 7:
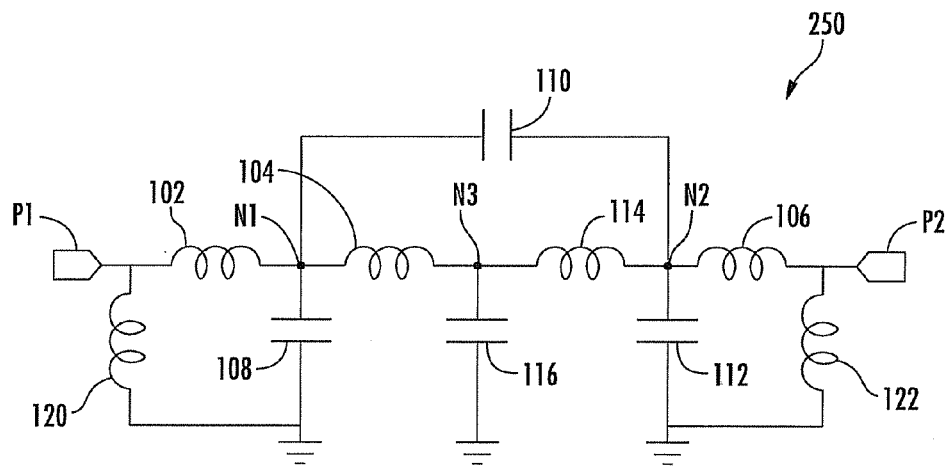
FIG. 7 is a circuit arrangement for a tunable matching network according to an embodiment of the presently disclosed subject matter.
Figure 8:
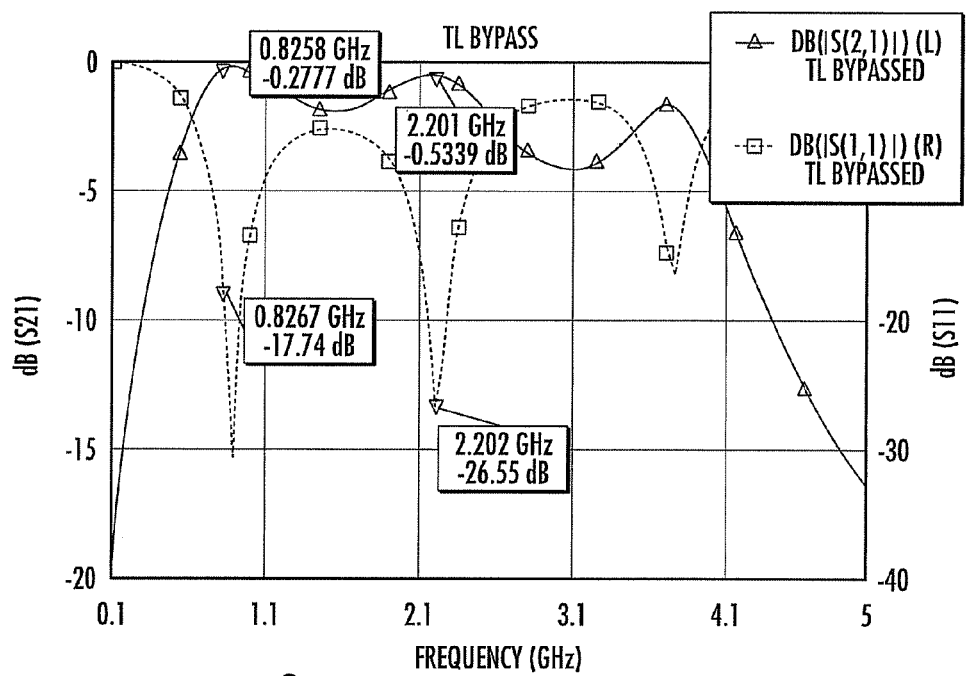
FIG. 8 is a graph of the frequency response of the tunable matching network shown in FIG. 7.

By modifying the distributed LC transmission line network in a manner similar to the modification to the single PI network discussed above, however, a wider bandwidth transparent state can be obtained. Specifically, FIG. 7 shows a modified distributed LC transmission line network, generally designated 250, in which first and second shunt inductors 120 and 122 (e.g., 10 nH shunt inductors) are again added to both input and output.

It should be noted that the simulations discussed above were developed assuming an ideal network with known parasitics. Practical implementations can often have more parasitics that are less ideal. On the other hand, it is anticipated that future processes and designs may have lower parasitics and thus require different shunt inductor values for optimum performance.

Figure 9:
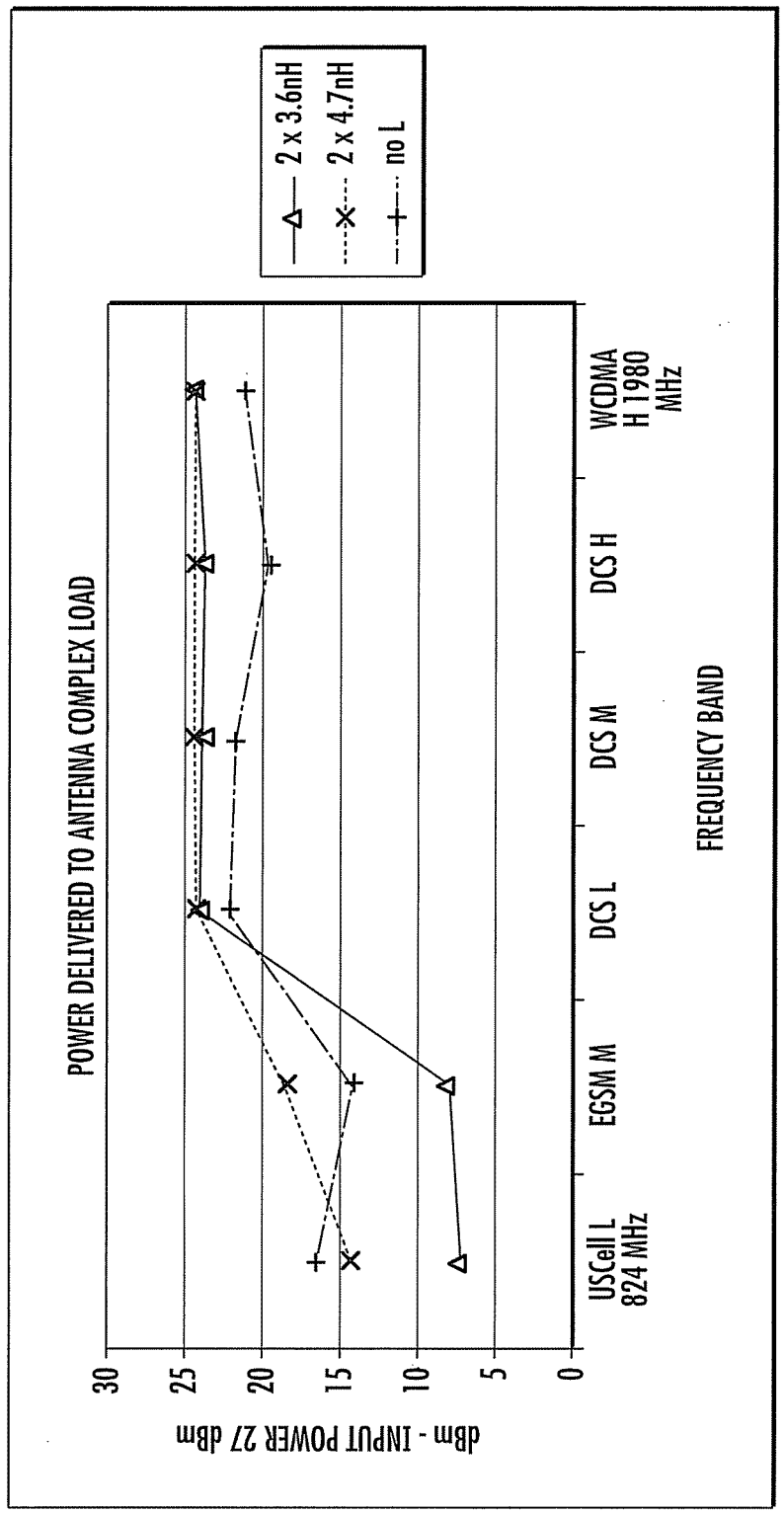
FIG. 9 is a graph comparing the power delivered to a network across various frequency bands for three different network configurations.

The graph in FIG. 9 provides a comparison of the power delivered to a network across various frequency bands for three different network configurations. The 'no L' (i.e., no inductor) case is the base matching network design ('TL bypassed') shown in FIG. 5. As can be seen, the tuning capability is limited at high frequencies by fixed parasitic capacitance to ground, which likely arises from both the capacitors themselves and the packaging/inductor. By comparison, adding shunt inductance at the input and output of the matching network (FIG. 9 shows results for both for 3.6 nH and 4.7 nH shunt inductors) can at least partially compensate for the parasitic capacitance, which can in turn lead to better high frequency performance. Large inductance values are closer to the no inductance case (i.e., an open circuit) with smaller inductances providing increasing compensation for the capacitance to ground. If the inductance value is lowered too far, however, overcompensation can occur and the low frequency tuning is degraded. For the case below, for example, FIG. 9 shows that for the particular configuration studied, it appears that shunt inductors set at 4.7 nH provide improved performance in maintaining the low frequency tuning while improving the high frequency response, whereas shunt inductors set at 3.6 nH significantly impact the low frequency tuning.

In addition, regarding concerns with electrostatic discharges (ESDs), it is noted that ESDs can be encountered during manufacturing and handling of components as well as in system use, which can result in damage to dielectrics and lead to product failures. One approach to minimizing the effect of ESDs is to make use of filtering in the system such that the ESD voltage developed across the component is greatly reduced. One approach that can be used is a high pass filter, which can include a shunt inductor. In this regard, the subject matter disclosed hereinabove can have the additional benefit of providing this high-pass characteristic, and thus the concepts discussed herein can greatly improve the ESD survivability of the matching network products.

An optimum tunable matching network can further be configured to reach high reactances for correcting poor match conditions at low frequencies and also to achieve high transparency at high frequencies. Achieving this range of capabilities enables a full range of tuning for these frequencies and for all frequencies in between. It is also advantageous to minimize the size and complexity of the network to simplify tuning and minimize physical size and cost. In this regard, adding shunt inductance to the network compensates for some of the parasitic capacitance and enables a wider useful bandwidth for the tuning network. Thus, as an alternative to or in conjunction with maintaining acceptable tuning performance for a desired low frequency limit of the matching network, the specifications of first and second shunt inductors 120 and 122 can be selected to maintain acceptable ESD performance.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter. For instance, although the above examples applied shunt inductance to single PI networks and distributed LC transmission line networks, the principles discussed herein can be applied to any of a variety of network topologies, including by not limited to double PI, bypassed PI, and bypassed double PI networks.

What is claimed is:

1. A modified tunable matching network comprising:
   a tunable matching network exhibiting parasitic capacitance to ground; and
   one or more shunt inductors connected to the tunable matching network for improving high-frequency performance of the tunable matching network, the one or more shunt inductor comprising:
      a first shunt inductor connected to an input of the tunable matching network; and
      a second shunt inductor connected to an output of the tunable matching network.

2. The network of claim 1, wherein the tunable matching network comprises:
   at least one inductor; and
   at least one tunable capacitor in parallel with the inductor;
   wherein the at least one tunable capacitor tunes a self-resonant frequency and a reactive impedance of the at least one inductor.

3. The network of claim 1, wherein the one or more shunt inductors are externally connected to the tunable matching network.

4. The network of claim 1, wherein the one or more shunt inductors are selected to maintain acceptable tuning performance for a desired low frequency limit of the matching network and/or acceptable ESD performance.

5. The network of claim 1, wherein the tunable matching network is selected from the group consisting of PI, double PI, bypassed PI, bypassed double PI, and distributed lumped inductor single PI topologies.

6. The network of claim 5, wherein the tunable matching network comprises:
   a first inductor, a second inductor, and a third inductor connected in series;
   a first tunable capacitor coupled between a series connection of the first inductor, the second inductor, and ground;
   a second tunable capacitor coupled between a series connection of the second inductor, the third inductor, and ground; and
   a third tunable capacitor in parallel with the second inductor, wherein the third capacitor tunes a self-resonant frequency of the second inductor.

7. The network of claim 1, wherein the tunable matching network comprises:
   a first inductor coupled to a first port and a first node;
   a second inductor coupled between the first node and a second node;
   a first capacitor coupled between the first node and a ground node;
   a second capacitor coupled between the second node and the ground node;
   a third inductor coupled between the second node and a third node;
   a third capacitor coupled between the third node and the ground node;
   a fourth inductor coupled between the third node and a second port; and
   a fourth capacitor coupled between the first node and the third node,
   wherein the fourth capacitor is a variable capacitor, and wherein the fourth capacitor tunes a self-resonant frequency of the series combination of the second and third inductors.

8. The network of claim 7, wherein the first inductor and the fourth inductor are part of the input and output feed parasitics.

9. The network of claim 7, wherein the first inductor and the fourth inductor are as small as possible.

10. A tunable matching network comprising:
    at least one inductor connected between an input and an output;
    at least one tunable capacitor in parallel with the inductor; and
    one or more shunt inductors connected to one or both of the input or the output;
    wherein the at least one tunable capacitor is operable to tune a self-resonant frequency and a reactive impedance of the at least one inductor; and
    wherein the one or more shunt inductors are operable to improve high-frequency performance of the tunable matching network.

11. A method of modifying a tunable matching network comprising:
    connecting a first shunt inductor to an input of a tunable matching network exhibiting parasitic capacitance to ground; and
    connecting a second shunt inductor to an output of the tunable matching network,
    whereby high-frequency performance of the tunable matching network is improved.

12. The method of claim 11, wherein connecting one or more shunt inductors comprises connecting an external shunt inductor to the tunable matching network.

13. The method of claim 11, wherein connecting one or more shunt inductors comprises integrating an internal shunt inductor into the tunable matching network.

14. The method of claim 11, wherein connecting one or more shunt inductors to a tunable matching network comprises connecting the one or more shunt inductors to a network comprising at least one inductor and at least one tunable capacitor in parallel with the inductor;
   wherein the at least one tunable capacitor tunes a self-resonant frequency and a reactive impedance of the at least one inductor.

15. The method of claim 11, wherein the tunable matching network is selected from the group consisting of PI, double PI, bypassed PI, bypassed double PI, and distributed lumped inductor single PI topologies.

16. The method of claim 11, wherein the one or more shunt inductors are selected to maintain acceptable tuning performance for a desired low frequency limit of the matching network and/or acceptable ESD performance.

17. A method of modifying a tunable matching network comprising:
   connecting one or more shunt inductors to a tunable matching network exhibiting parasitic capacitance to ground, the tunable matching network comprising:
   at least one inductor connected between an input and an output; and
   at least one tunable capacitor in parallel with the inductor, wherein the at least one tunable capacitor tunes a self-resonant frequency and a reactive impedance of the at least one inductor;
   wherein the one or more shunt inductors are connected to one or both of the input or the output of the tunable matching network; and
   whereby high-frequency performance of the tunable matching network is improved.

* * * * *